US 8,343,815 B2

(12) United States Patent
Bangsaruntip et al.

(10) Patent No.: US 8,343,815 B2
(45) Date of Patent: Jan. 1, 2013

(54) TFET WITH NANOWIRE SOURCE

(75) Inventors: Sarunya Bangsaruntip, Mount Kisco, NY (US); Isaac Lauer, Mahopac, NY (US); Amlan Majumdar, White Plains, NY (US); Jeffrey Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 12/777,881

(22) Filed: May 11, 2010

(65) Prior Publication Data
US 2011/0278542 A1 Nov. 17, 2011

(51) Int. Cl.
*H01L 29/72* (2006.01)
(52) U.S. Cl. ........ 438/149; 257/288; 257/347; 257/401; 257/24; 977/723; 977/938; 438/197; 438/519; 438/522; 438/745
(58) Field of Classification Search .................... 257/24, 257/288, 347, 401; 977/723, 938; 438/149, 438/197, 519, 522, 745
See application file for complete search history.

(56) References Cited

U.S. PATENT DOCUMENTS
2008/0224224 A1 9/2008 Vandenderghe et al.
2009/0057762 A1* 3/2009 Bangsaruntip et al. ....... 257/347

OTHER PUBLICATIONS

Le Royer et al., Exhaustive Experimental Study of Tunnel Field Effect Transistors (TFETs): From Materials to Architecture, IEEE Xplore, Mar. 17, 2010, pp. 53-56, IEEE.
Knoch, Optimizing Tunnel FET Performance—Impact of Device Structure, Transistor Dimensions and Choice of Material, IEEE Xplore, Mar. 17, 2010, pp. 45-46, IEEE.
Appenzeller et al., Toward Nanowire Electronics, IEEE Transactions on Electron Devices, Nov. 2008, pp. 2827-2845, vol. 55, No. 11, IEEE.
Verhulst et al., Tunnel field-effect transistor without gate-drain overlap, Applied Physics Letters 91, 2007, pp. 053102-1-053102-3, vol. 91, American Institute of Physics.

* cited by examiner

*Primary Examiner* — Edward Wojciechowicz
(74) *Attorney, Agent, or Firm* — Cantor Colburn LLP; Vazken Alexanian

(57) ABSTRACT

A tunnel field effect transistor (TFET) includes a source region, the source region comprising a first portion of a nanowire; a channel region, the channel region comprising a second portion of the nanowire; a drain region, the drain region comprising a portion of a silicon pad, the silicon pad being located adjacent to the channel region; and a gate configured such that the gate surrounds the channel region and at least a portion of the source region.

19 Claims, 7 Drawing Sheets

200

| 203 |
|---|
| 202 |
| 201 |

FIG. 2

TFET WITH NANOWIRE SOURCE

This invention was made with Government support under Government Contract FA8650-08-C-7806, awarded by the Defense Advanced Research Projects Agency (DARPA). The Government has certain rights in this invention.

FIELD

This disclosure relates generally to the field of tunnel field effect transistors.

DESCRIPTION OF RELATED ART

Tunnel field effect transistors (TFETs) may be used as a replacement for or complement to metal-oxide-semiconductor FETs (MOSFETs). A TFET may comprise a nanowire channel, which may provide good electrostatic control of the channel due to gate-all-around (GAA) geometry. However, relatively high fields at the drain end of a nanowire channel TFET may lead to parasitic ambipolar behavior that increases the TFET off current, resulting in a relatively inefficient device.

SUMMARY

In one aspect, a method for forming a tunnel field effect transistor (TFET) comprising a nanowire source includes forming a nanowire and first and second silicon pads in a silicon layer of a silicon-on-insulator (SOI) substrate, wherein the nanowire is located between the first and second silicon pads; forming a gate comprising a dielectric layer and a gate polysilicon region around a part of the nanowire, wherein the dielectric layer is formed adjacent to and surrounding the part of the nanowire, and the gate polysilicon region is formed over the dielectric layer; implanting a portion of the second silicon pad to form a drain region; and implanting the first silicon pad and a first portion of the nanowire to form the nanowire source, wherein a part of the first portion of the nanowire is located inside the gate.

In one aspect, a tunnel field effect transistor (TFET) includes a source region, the source region comprising a first portion of a nanowire; a channel region, the channel region comprising a second portion of the nanowire; a drain region, the drain region comprising a portion of a silicon pad, the silicon pad being located adjacent to the channel region; and a gate configured such that the gate surrounds the channel region and at least a portion of the source region.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 2 illustrates an embodiment of a silicon-on-insulator (SOI) wafer.

DETAILED DESCRIPTION

Embodiments of systems and methods for a TFET with a nanowire source are provided, with exemplary embodiments being discussed below in detail. The TFET source injection point may be located in a GAA nanowire, and the drain may be located in a planar single-gated region. This configuration suppresses ambipolar behavior in the TFET, thereby reducing the TFET off current.

Figure 1:
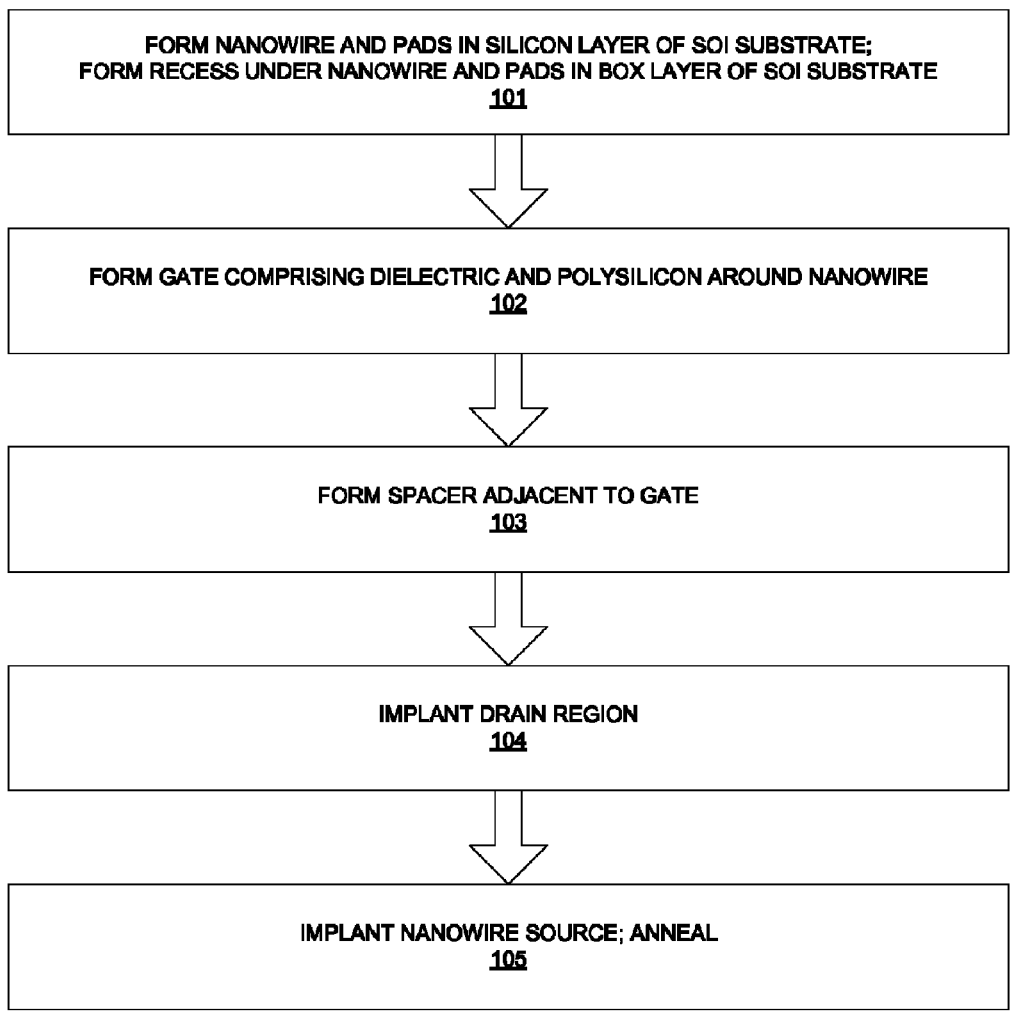
FIG. 1 illustrates an embodiment of a method of forming a TFET with a nanowire source.
Figure 2:
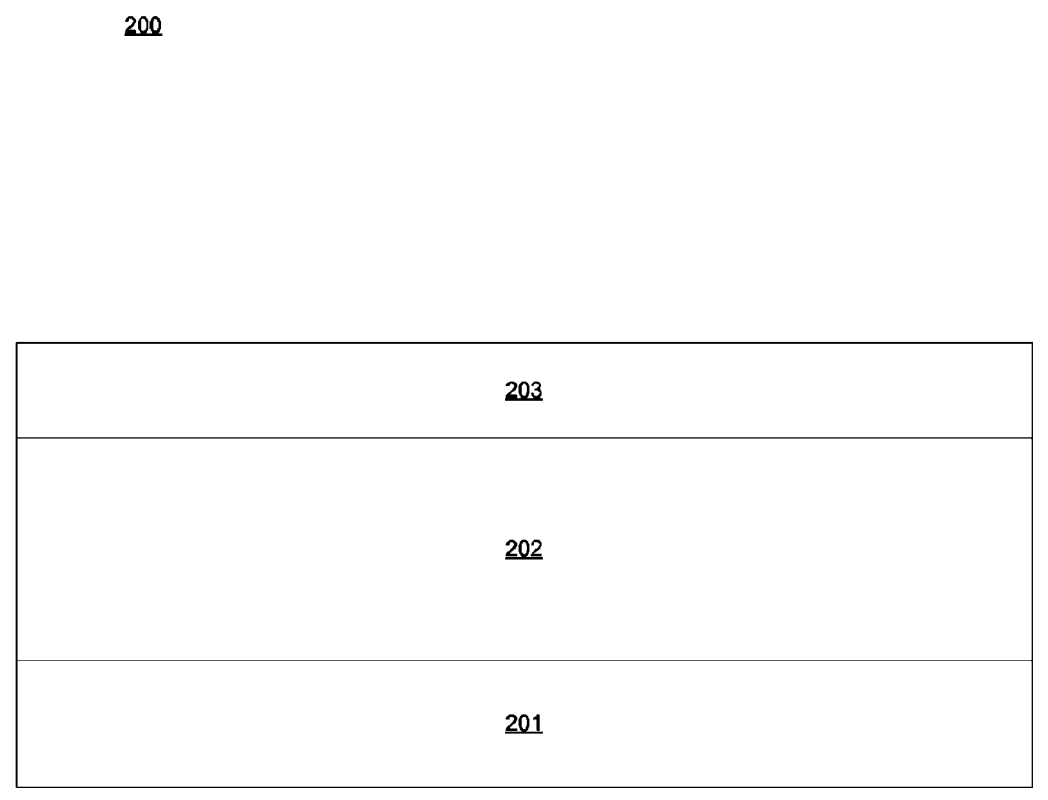
Figure 3:
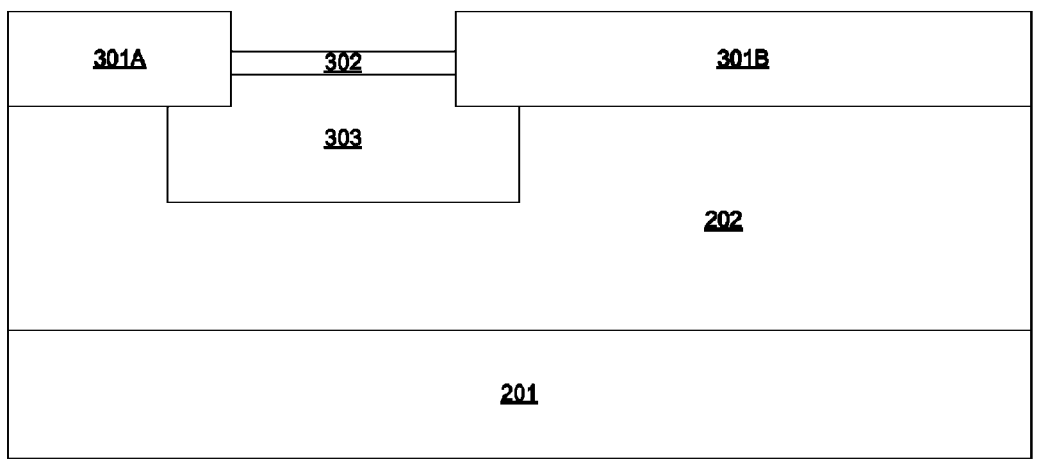
FIG. 3 illustrates an embodiment of the SOI wafer of FIG. 2 after formation of a nanowire.

FIG. 1 illustrates an embodiment of a method of forming a TFET with a nanowire source. FIG. 1 is discussed with reference to FIGS. 2-7. In block 101, a SOI wafer 200 as shown in FIG. 2 is used to form a structure 300 comprising a silicon nanowire 302 as shown in FIG. 3. SOI wafer 200 comprises silicon substrate 201 under buried oxide (BOX) 202 under silicon layer 203. To form nanowire 302, the locations of nanowire 302 and silicon pads 301A-B are lithographically defined and etched in silicon layer 203. After nanowire 302 and silicon pads 301A-B are etched, a portion of BOX 202 is removed to form recess 303 under nanowire 302 and silicon pads 301A-B. Recess 303 may be formed using a hydrofluoric (HF) acid dip in some embodiments. Nanowire 302 is located between silicon pads 301A-B, may have a length between about 50nanometers (nm) and about 200 nm in some embodiments, and may have a diameter between about 3 nm and about 50 nm in some embodiments.

Figure 4:
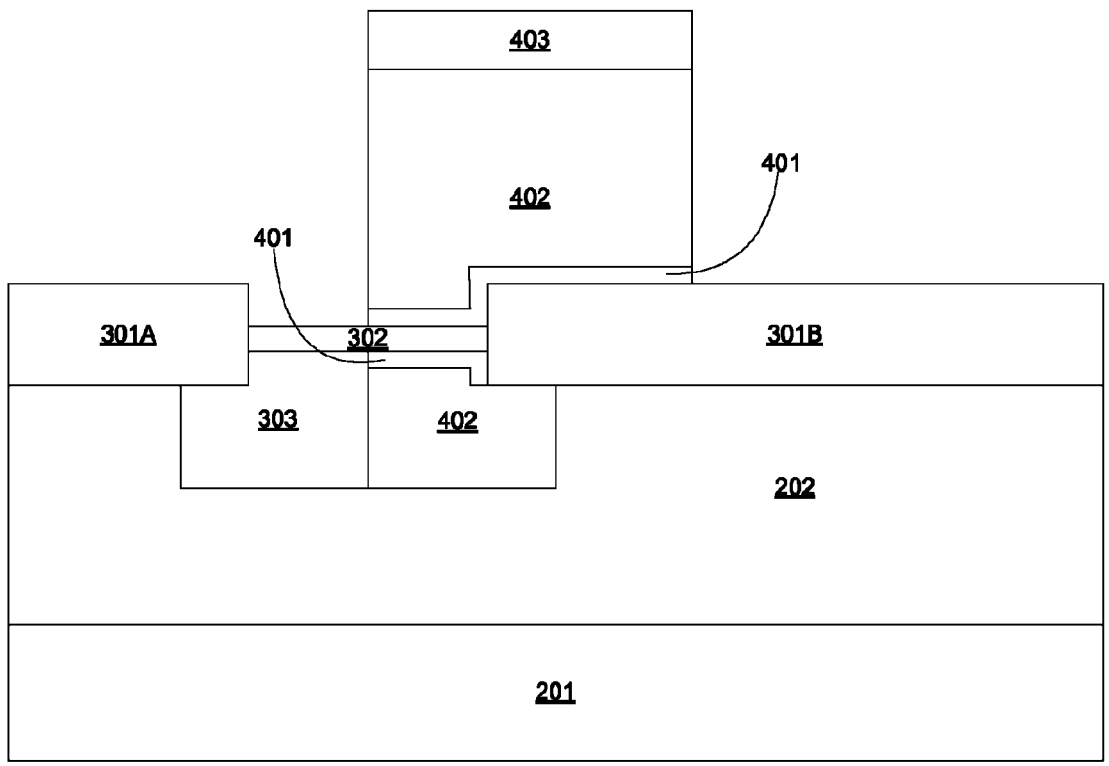
FIG. 4 illustrates an embodiment of the structure of FIG. 3 after formation of a gate.

In block 102, a gate comprising dielectric layer 401 and gate polysilicon 402 is formed around nanowire 302 and in recess 303, as shown in FIG. 4. The gate has a GAA configuration. Dielectric layer 401 completely surrounds nanowire 302. Dielectric layer 401 may comprise thermally grown oxide or a high-k material in some embodiments. The gate may optionally comprise a metal layer (not shown) located between dielectric layer 401 and gate polysilicon 402. A hardmask layer 403, which may comprise silicon nitride, is then formed over the gate polysilicon 402.

Figure 5:
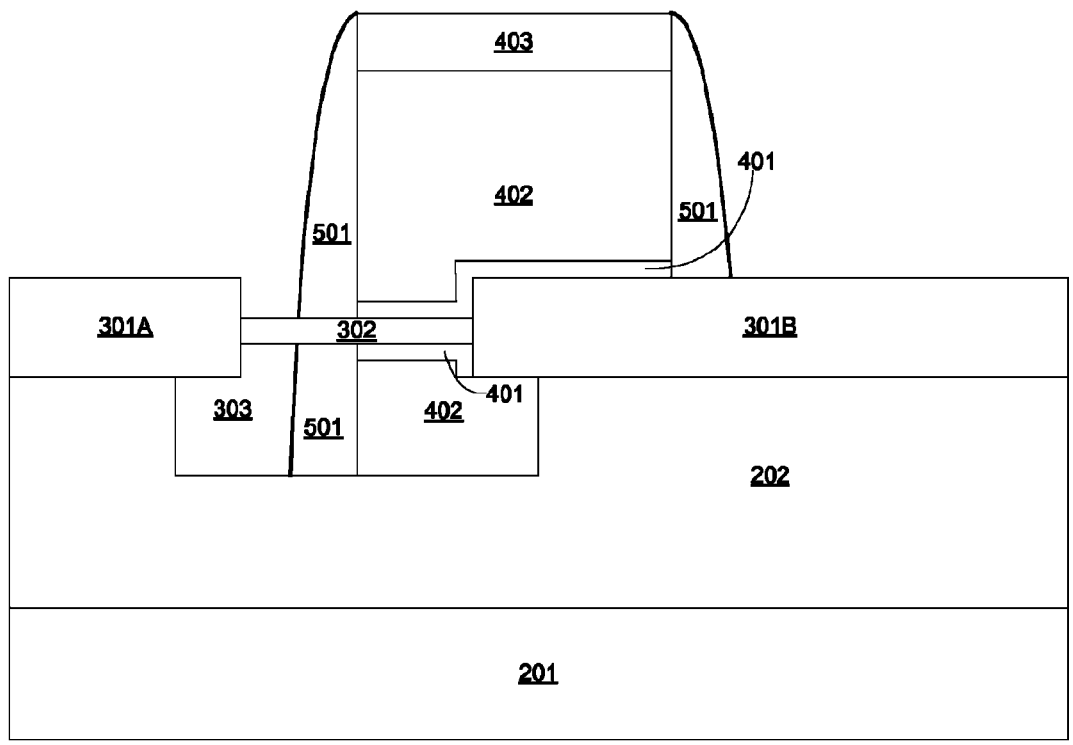
FIG. 5 illustrates an embodiment of the structure of FIG. 4 after formation of a spacer.

In block 103, a spacer 501 is formed adjacent to the gate comprising dielectric layer 401 and gate polysilicon 402, as shown in FIG. 5. Spacer 501 may comprise a nitride in some embodiments.

Figure 6:
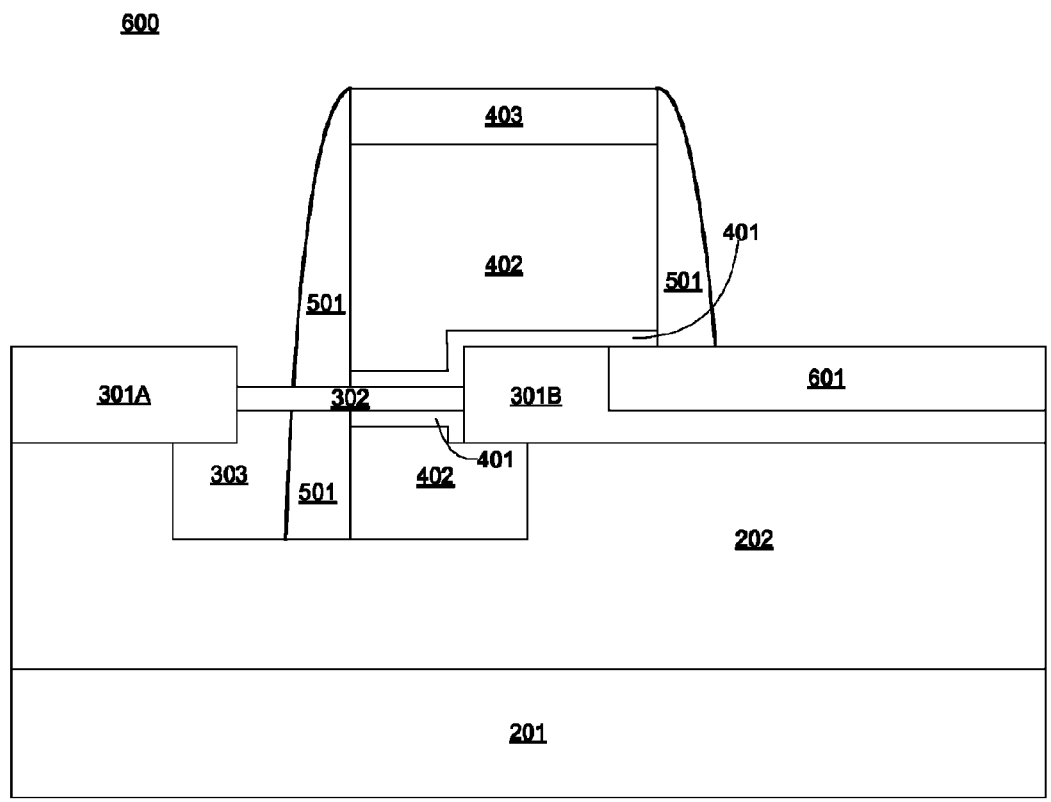
FIG. 6 illustrates an embodiment of the structure of FIG. 5 after formation of the drain region.
Figure 7:
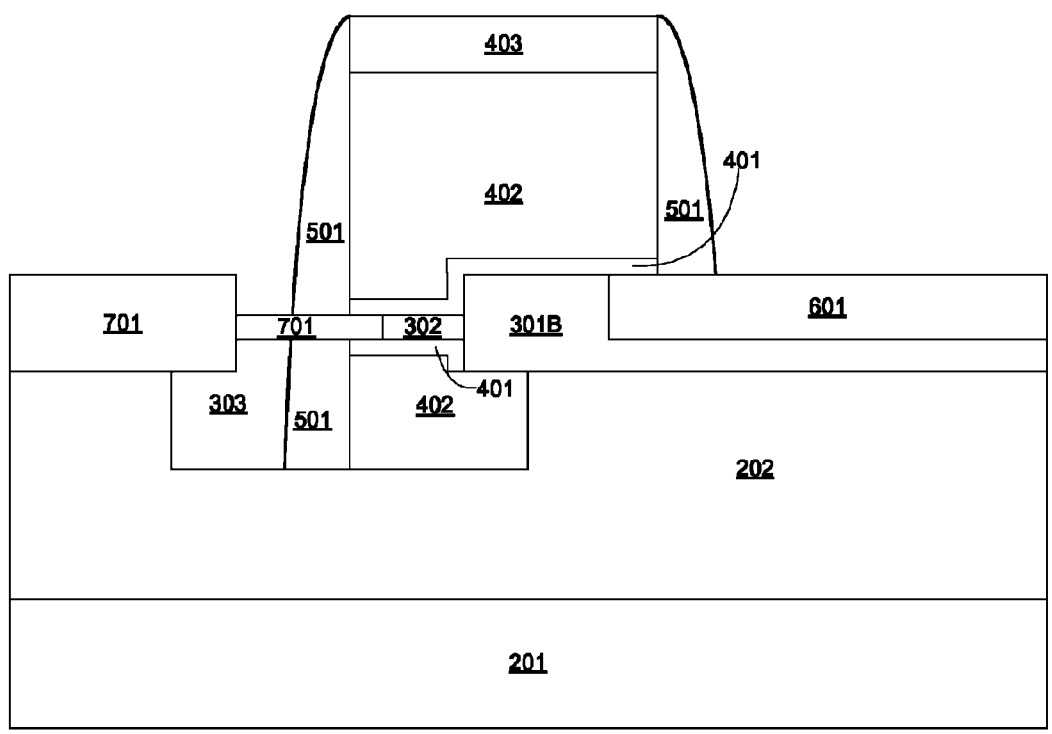
FIG. 7 illustrates an embodiment of a TFET with a nanowire source.

In block 104, a drain region 601 is formed in silicon pad 301B by implantation of dopants, as shown in FIG. 6. Drain region 601 may be implanted with n-type dopants including but not limited to arsenic (As) or phosphorous (P). Implantation of drain region 601 may be followed by an anneal in some embodiments. Drain region 601 is located in a planar single-gated region In block 105, silicon pad 301A and a portion of nanowire 302 are implanted with dopants to form nanowire source 701 as shown in FIG. 7. Nanowire source 701 may be implanted with p-type dopants including but not limited to boron (B) or boron diflouride ($BF_2$). Implantation of nanowire source 701 is followed by an anneal. The resulting device comprises a TFET 700 with a nanowire source 701. A portion of nanowire source 701 comprises a GAA configuration (i.e., a portion of nanowire source 701 is located inside the gate of TFET 700). The undoped portion of nanowire 302 comprises the channel of TFET 700; the channel also comprises a GAA configuration. TFET 700 may exhibit good electrostatic control of the nanowire channel 302 while having reduced ambipolar behavior due to the GAA portion of nanowire source 701. In some embodiments, hardmask layer 403 may be removed after formation of nanowire source 701, and a top portion of gate polysilicon 402 may be silicided to form a gate contact (not shown).

The technical effects and benefits of exemplary embodiments include formation of a TFET with reduced off current.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for forming a tunnel field effect transistor (TFET) comprising a nanowire source, the method comprising:
   forming a nanowire and first and second silicon pads in a silicon layer of a silicon-on-insulator (SOI) substrate, wherein the nanowire is located between the first and second silicon pads;
   forming a gate comprising a dielectric layer and a gate polysilicon region around a first portion of the nanowire, wherein the dielectric layer is formed adjacent to and surrounding the first portion of the nanowire and a first portion of the second silicon pad, and the gate polysilicon region is formed over the dielectric layer, wherein the gate is located on top of the first portion of the second silicon pad, and is not located on top of any portion of the first silicon pad;
   implanting a second portion of the second silicon pad that is not located underneath the gate to form a drain region; and
   implanting the first silicon pad and a second portion of the nanowire to form the nanowire source.

2. The method of claim 1, wherein the SOI substrate comprises a buried oxide (BOX) layer under the silicon layer, and further comprising forming a recess underneath the nanowire by removing a portion of the BOX layer before forming the gate.

3. The method of claim 2, wherein forming the recess comprises a hydrofluoric (HF) acid dip.

4. The method of claim 1, wherein the nanowire has length between about 50 nanometers (nm) and about 200 nm, and a diameter between about 3 nm and about 50 nm.

5. The method of claim 1, further comprising forming a hard mask layer comprising silicon nitride over the gate polysilicon region before implanting the second silicon pad.

6. The method of claim 5, further comprising removing the hard mask layer and siliciding a portion of the gate polysilicon region after forming the nanowire source.

7. The method of claim 1, further comprising forming a spacer comprising a nitride adjacent to the gate, wherein the second portion of the nanowire is exposed by the spacer.

8. The method of claim 1, wherein implanting the second portion of the second silicon pad to form the drain region comprises implantation with n-type dopants.

9. The method of claim 1, wherein implanting the first silicon pad and the second portion of the nanowire to form the nanowire source comprises implantation with p-type dopants.

10. The method of claim 1, further comprising annealing the drain region and the nanowire source after implantation.

11. The method of claim 1, wherein the gate further comprises a metal layer located between the dielectric layer and the gate polysilicon region.

12. The method of claim 1, wherein the dielectric layer comprises one of thermally grown oxide and a high-k material.

13. The method of claim 1, wherein the first portion of the nanowire comprises a channel of the TFET that is located inside the gate and is not implanted.

14. The method of claim 2, wherein a portion of the gate polysilicon is formed in the recess underneath the nanowire.

15. The method of claim 2, wherein the recess is additionally located underneath a portion of the first silicon pad.

16. The method of claim 2, wherein the recess is additionally located underneath a portion of the second silicon pad.

17. The method of claim 1, wherein a portion of the nanowire source is located inside the gate.

18. The method of claim 1, wherein the second portion of the nanowire is exposed after formation of the gate.

19. The method of claim 1, wherein the drain region is not located in any portion of the nanowire.

* * * * *